US007399188B1

(12) United States Patent  
Shen et al.

(10) Patent No.: US 7,399,188 B1  
(45) Date of Patent: Jul. 15, 2008

(54) TERMINALS OF A RECEPTACLE CONNECTOR FIRMLY MOUNTING ON A PRINTED CIRCUIT BOARD

(75) Inventors: Lili Shen, Tu-Cheng (TW); Hong-tu Zhang, Tu-Cheng (TW); Mao-jung Huang, Tu-Cheng (TW)

(73) Assignee: Cheng Uei Precision Industry Co., Ltd., Taipei Hsien (TW)

( * ) Notice: Subject to any disclaimer, the term of this patent is extended or adjusted under 35 U.S.C. 154(b) by 0 days.

(21) Appl. No.: 11/979,644

(22) Filed: Nov. 7, 2007

(51) Int. Cl.
*H01R 12/00* (2006.01)
*H05K 1/00* (2006.01)

(52) U.S. Cl. .................................. 439/78; 439/660
(58) Field of Classification Search ............ 439/78, 439/74, 83, 660, 650, 678, 689, 695, 751
See application file for complete search history.

(56) References Cited

U.S. PATENT DOCUMENTS 5,667,393 A * 9/1997 Grabbe et al. ............... 600/443
6,454,610 B1 * 9/2002 Yu .............................. 439/660
6,719,573 B2 * 4/2004 Koehler et al. ................ 439/79

* cited by examiner

*Primary Examiner*—Hae Moon Hyeon
(74) *Attorney, Agent, or Firm*—Rosenberg, Klein & Lee

(57) ABSTRACT

A receptacle connector includes a housing, an insulating body and a plurality of terminals. The housing defines a recess for receiving the insulating body. The insulating body defines cavities on top and bottom surfaces thereof. A back surface of the insulating body defines terminal channels communicating with the corresponding cavities. Each of the terminals has a base portion. The middle of the base portion extends forward to form an annular soldering portion and a connecting portion extends rearward from the base portion. A free end of the connecting portion bends to form a contact portion. The base portion and the connecting portion are received in the cavities and the contact portion is received in the terminal channel. The soldering portion protrudes out from a front surface of the insulating body for being soldered in a printed circuit board.

6 Claims, 3 Drawing Sheets

TERMINALS OF A RECEPTACLE CONNECTOR FIRMLY MOUNTING ON A PRINTED CIRCUIT BOARD

BACKGROUND OF THE INVENTION

1. Field of the Invention

The present invention generally relates to a receptacle connector, and more particularly to a receptacle connector with terminals capable of being mounted on a printed circuit board firmly.

2. The Related Art

Traditionally, a receptacle connector includes a housing, an insulating body and a plurality of first terminals. The housing has a recess to receive the insulating body. The insulating body defines a plurality of cavities for receiving the first terminals. Each first terminal has a soldering portion and a contact portion. When a plug connector inserts into the receptacle connector, second terminals of the plug connector contact the corresponding contact portions of the first terminals of the receptacle connector. The soldering portion of the first terminal of the receptacle connector is soldered on a printed circuit board.

The soldering portion of the first terminal of the receptacle connector is usually needle-shaped or flat-shaped. If the soldering portion is needle-shaped, the printed circuit board defines an aperture for receiving the corresponding soldering portion of the first terminal. If the soldering portion is flat-shaped, the soldering portion directly abuts against a surface of the printed circuit board. However, the engagement provided by two above-mentioned ways is not firm, so that the signal transmission between the receptacle connector and the printed circuit board is easily interrupted.

SUMMARY OF THE INVENTION

An object of the present invention is to provide a receptacle connector, which makes terminals and a printed circuit board engaged with each other firmly.

The receptacle connector includes a housing, an insulating body mating with the housing and a plurality of terminals received in the insulating body. The housing has a top wall, a bottom wall and two sidewalls. A recess is surrounded by the top wall, the bottom wall and the sidewalls for receiving the insulating body. The insulating body received in the recess defines a plurality of first cavities in the front of a top surface and a bottom surface thereof. The middle of each of the first cavities extends rearward and passes through a back surface of the insulating body to form a second cavity. A preventing surface is formed at the junction of the first cavity and the second cavity. The back surface of the insulating body defines a plurality of terminal channels communicating with the corresponding second cavities. Each of the terminals received in the insulating body has a base portion. The middle of the base portion extends forward to form an annular soldering portion and a connecting portion extends rearward from the base portion. A free end of the connecting portion bends to form a contact portion. The base portion is received in the first cavity of the insulating body and abuts against the preventing surface, the connecting portion is received in the second cavity and the contact portion is received in the corresponding terminal channel. The soldering portion protrudes out from a front surface of the insulating body.

As described above, when the receptacle connector is welded on a printed circuit board with a plurality of apertures corresponding to the soldering portions, the soldering portion inserts into the corresponding aperture and shrinks inward to generate an elasticity for ensuring that the soldering portion can tightly abut against inner surfaces of the aperture. Meanwhile, the soldering portion has a larger contact-area welded on the printed circuit board with more soldering tin to have the receptacle connector and the printed circuit board engaged with each other firmly.

BRIEF DESCRIPTION OF THE DRAWINGS

The present invention will be apparent to those skilled in the art by reading the following description of a preferred embodiment thereof, with reference to the attached drawings, in which.

DETAILED DESCRIPTION OF THE PREFERRED EMBODIMENT

Figure 1:
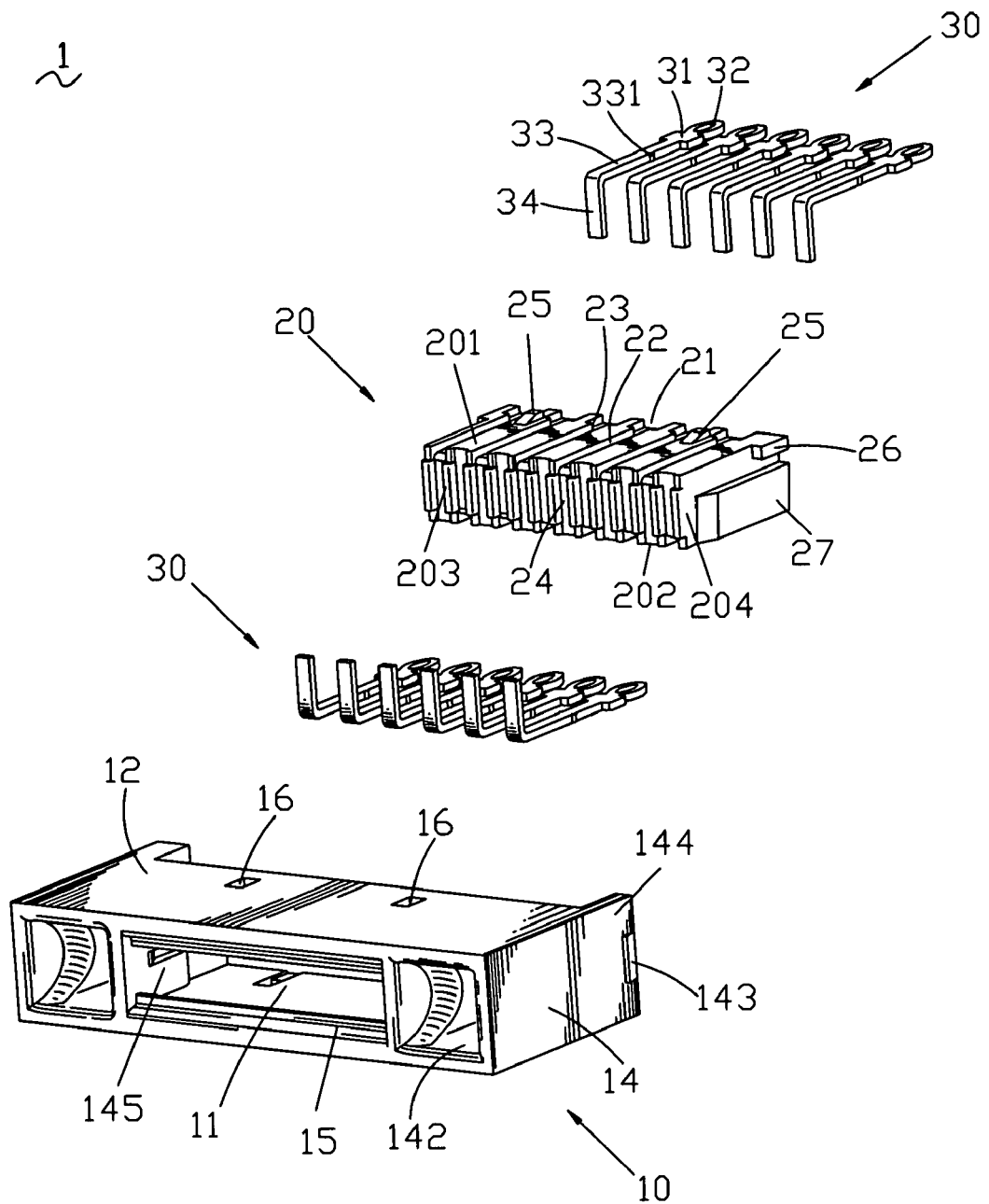
FIG. 1 is an exploded view of a receptacle connector in accordance with the present invention.

With reference to FIG. 1, a receptacle connector 1 includes a housing 10, an insulating body 20 mating with the housing 10 and a plurality of terminals 30 received in the insulating body 20.

Figure 3:
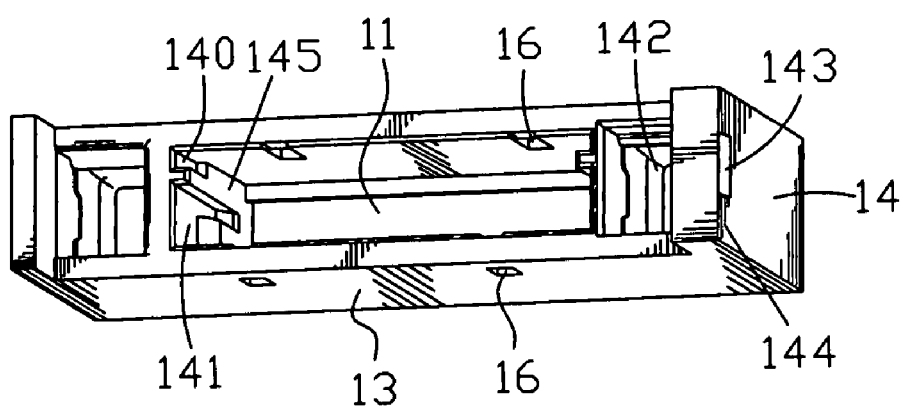
FIG. 3 is a perspective view of a housing of the receptacle connector.

Referring to FIG. 1 and FIG. 3, the housing 10 is of rectangular shape and has a top wall 12, a bottom wall 13 and two sidewalls 14, which define a rectangular recess 11 passing through a front and a back of the housing 10 for receiving the insulating body 20. Rear ends of the top wall 12 and the bottom wall 13 respectively extend to the recess 11 to form a pair of preventing walls 15 facing to each other. The top wall 12 and the bottom wall 13 define a plurality of fixing holes 16 communicating with the recess 11. A front of an inner surface 145 of the sidewall 14 longitudinally defines a first fixing fillister 140 and a second fixing fillister 141 paralleling with each other and communicating with the recess 11. Each sidewall 14 defines a perforation 142 passing through a front and a back thereof. The sidewall 14 extends a little forward to form a board 144 adjacent to the outside of the perforation 142, the outside of the board 144 defines a locking block 143.

Referring to FIG. 1, the insulating body 20 is of rectangular shape and corresponding to the recess 11 of the housing 10. The front of a top surface 201 and a bottom surface 202 of the insulating body 20 defines a plurality of first cavities 21 arranged at regular intervals along a longwise direction thereof and communicating with the outside respectively. The middle of each first cavity 21 extends rearward and passes through a back surface 203 of the insulating body 20 to form a second cavity 22. Accordingly, a preventing surface 23 is formed at the junction of the first cavity 21 and the second cavity 22. The back surface 203 of the insulating body 20 vertically defines a plurality of terminal channels 24 communicating with the corresponding second cavities 22. The top surface 201 and the bottom surface 202 of the insulating body 20 define a plurality of fixing lumps 25 in accordance with the fixing holes 16 of the housing 10. The front of each of two side surfaces 204 of the insulating body 20 respectively defines a first fixing rib 26 and a second fixing rib 27 paralleling with each other, which are received in the corresponding first fixing fillister 140 and second fixing fillister 141 of the housing 10 respectively.

Each terminal 30 has a base portion 31, the middle of the base portion 31 extends forward to form an oval-annular soldering portion 32 and extends rearward to form a connecting portion 33, a pair of bumps 331 are formed at two sides of the connecting portion 33. A free end of the connecting portion 33 bends and then vertically extends to form a contact portion 34.

Figure 2:
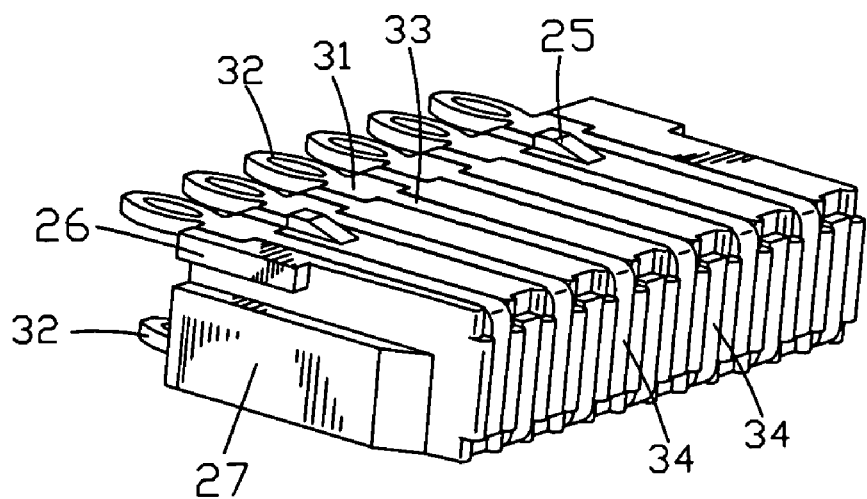
FIG. 2 is a perspective view showing a plurality of terminals being mounted in an insulating body.
Figure 4:
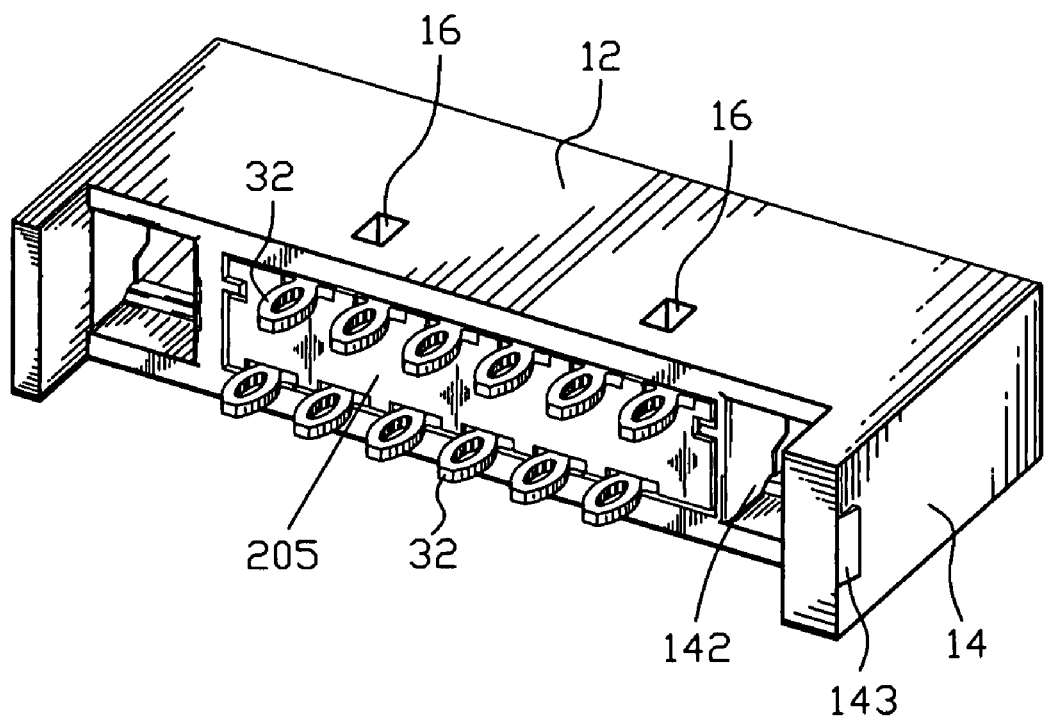
FIG. 4 is a perspective view of the receptacle connector of FIG. 1.

Referring to FIG. 2 and FIG. 4, in assembly, the base portion 31 of the terminal 30 is received in the first cavity 21 of the insulating body 20 and abuts against the preventing surface 23. The connecting portion 33 is received in the second cavity 22 and the bumps 331 abut against two sides of the second cavity 22 respectively. The contact portion 34 is received in the terminal channel 24. The soldering portion 32 protrudes out from a front surface 205 of the insulating body 20. The insulating body 20 is configured in the recess 11 of the housing 10. The fixing ribs 26, 27 are fixed in the corresponding fixing fillisters 140, 141 and the back surface 203 of the insulating body 20 abuts against the preventing walls 15. The fixing lumps 25 buckle into the corresponding fixing holes 16.

As described above, when the receptacle connector 1 is welded on a printed circuit board (not shown) with a plurality of apertures corresponding to the soldering portions 32, the soldering portion 32 inserts into the corresponding aperture and shrinks inward to generate an elasticity for ensuring that the soldering portion 32 can tightly abut against inner surfaces of the aperture. Meanwhile, the soldering portion 32 has a larger contact-area welded on the printed circuit board with more soldering tin to have the receptacle connector 1 and the printed circuit board engaged with each other firmly.

What is claimed is:

1. A receptacle connector, comprising:
    a housing, having a top wall, a bottom wall and two sidewalls, a recess surrounded by the top wall, the bottom wall and the sidewalls;
    an insulating body, received in the recess, defining a plurality of first cavities in the front of a top surface and a bottom surface thereof, the middle of each of the first cavities extending rearward and passing through a back surface of the insulating body to form a second cavity, a preventing surface formed at the junction of the first cavity and the second cavity, the back surface of the insulating body defining a plurality of terminal channels communicating with the corresponding second cavities; and
    a plurality of terminals, received in the insulating body, each of the terminals having a base portion, the middle of the base portion extending forward to form an annular soldering portion, and a connecting portion extending rearward from the base portion, a free end of the connecting portion bending to form a contact portion, the base portion received in the first cavity of the insulating body and abutting against the preventing surface, the connecting portion received in the second cavity and the contact portion received in the corresponding terminal channel, the annular soldering portion protruding out from a front surface of the insulating body for being soldered in a printed circuit board.

2. The receptacle connector as claimed in claim 1, wherein a front of an inner surface of the sidewall of the housing defines at least one fixing fillister communicating with the recess in a longitudinal direction, a front of a side surface of the insulating body defines at least one fixing rib received in the corresponding fixing fillister of the housing.

3. The receptacle connector as claimed in claim 2, wherein rear ends of the top wall and the bottom wall of the housing respectively extend to the recess to form a pair of preventing walls facing to each other, the back surface of the insulating body abuts against the preventing walls.

4. The receptacle connector as claimed in claim 3, wherein the top wall and the bottom wall of the housing define a plurality of fixing holes communicating with the recess, the top surface and the bottom surface of the insulating body define a plurality of fixing lumps buckling into the corresponding fixing holes.

5. The receptacle connector as claimed in claim 4, wherein the outside of the sidewall of the housing extends forward to form a board and the board defines a locking block.

6. The receptacle connector as claimed in claim 1, wherein the annular soldering portion is oval-annular shaped.

* * * * *